United States Patent
Wimplinger

(10) Patent No.: US 8,597,980 B2
(45) Date of Patent: Dec. 3, 2013

(54) METHOD FOR BONDING OF CHIPS ON WAFERS

(75) Inventor: Markus Wimplinger, Ried im Innkreis (AT)

(73) Assignee: EV Group GmbH, St. Florian (AT)

(*) Notice: Subject to any disclaimer, the term of this patent is extended or adjusted under 35 U.S.C. 154(b) by 0 days.

(21) Appl. No.: 12/736,040

(22) PCT Filed: Mar. 13, 2009

(86) PCT No.: PCT/EP2009/001825
§ 371 (c)(1),
(2), (4) Date: Sep. 3, 2010

(87) PCT Pub. No.: WO2009/115240
PCT Pub. Date: Sep. 24, 2009

(65) Prior Publication Data
US 2011/0020982 A1    Jan. 27, 2011

(30) Foreign Application Priority Data
Mar. 18, 2008 (EP) .................................... 08005016

(51) Int. Cl.
*H01L 21/00* (2006.01)
(52) U.S. Cl.
USPC .................................. 438/107; 257/E21.599
(58) Field of Classification Search
USPC ............. 438/107, 109; 257/E21.599, E21.502
See application file for complete search history.

(56) References Cited

U.S. PATENT DOCUMENTS

| | | | | |
|---|---|---|---|---|
| 5,090,609 A * | 2/1992 | Nakao et al. | ............... | 228/123.1 |
| 5,943,563 A | 8/1999 | Hübner | ........................ | 438/155 |
| 6,534,874 B1 | 3/2003 | Matsumura | ................... | 257/777 |
| 6,640,423 B1 * | 11/2003 | Johnson et al. | ................. | 29/740 |
| 2002/0056740 A1 | 5/2002 | Hayashi | ..................... | 288/110.1 |
| 2006/0035443 A1* | 2/2006 | Hsu et al. | ...................... | 438/464 |
| 2006/0131721 A1 | 6/2006 | Ito | ................. | 257/689 |
| 2006/0270108 A1* | 11/2006 | Farnworth et al. | ............ | 438/106 |
| 2007/0001281 A1 | 1/2007 | Ishino et al. | .................. | 257/686 |
| 2007/0048969 A1* | 3/2007 | Kwon et al. | ................. | 438/455 |
| 2007/0235496 A1* | 10/2007 | Yoganandan et al. | ......... | 228/6.1 |
| 2008/0050904 A1 | 2/2008 | Lake | ............................ | 438/612 |
| 2008/0308946 A1* | 12/2008 | Pratt | ............................ | 257/777 |
| 2009/0107545 A1* | 4/2009 | Moslehi | ....................... | 136/256 |

FOREIGN PATENT DOCUMENTS

| | | | | |
|---|---|---|---|---|
| AT | 007 038 U1 | 3/2003 | ............... | H05K 3/34 |
| EP | 1 675 171 A2 | 6/2006 | ............. | H01L 23/31 |
| JP | 10-503324 | 3/1998 | ............. | H01L 27/00 |
| JP | 2002-158257 | 5/2002 | ............. | H01L 21/60 |
| JP | 2004-273525 | 9/2004 | ........... | H01L 25/065 |
| JP | 2005-142210 | 6/2005 | ............. | H01L 21/60 |
| JP | 2006-179562 | 7/2006 | ............. | H01L 23/12 |
| WO | WO 2008/157001 A1 | 12/2008 | ............. | H01L 21/98 |

OTHER PUBLICATIONS

"3D Process Integration—Wafer-to-Wafer and Chip-to-Wafer Bonding," Thorsten Matthias et al., © 2007; pp. 231-237.

(Continued)

*Primary Examiner* — Shaun Campbell
(74) *Attorney, Agent, or Firm* — Kusner & Jaffe

(57) ABSTRACT

Method for bonding a plurality of chips onto a base wafer.

27 Claims, 5 Drawing Sheets

(56) References Cited

OTHER PUBLICATIONS

"Flip-Chip-to-Wafer Stacking: Enabling Technology for Volume Production of 3D System Integration on Wafer Level," Christoph Scherring, et al., 11 pages.

Notification of Reasons for Refusal (dated Feb. 26, 2013) issued in connection with corresponding Japanese Patent Application No. 2011-500083, with English translation.

* cited by examiner

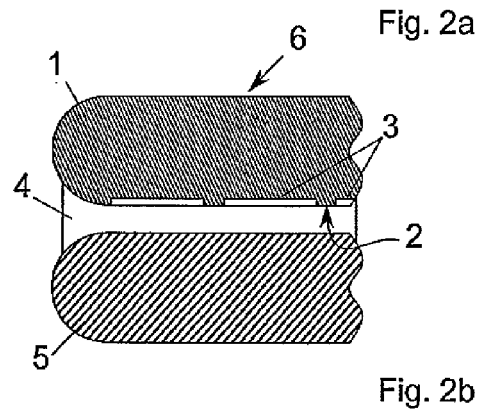
Fig. 2a
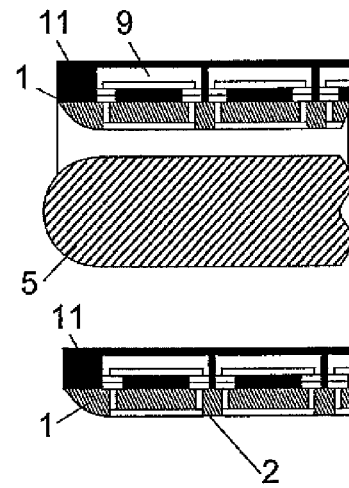
Fig. 2f
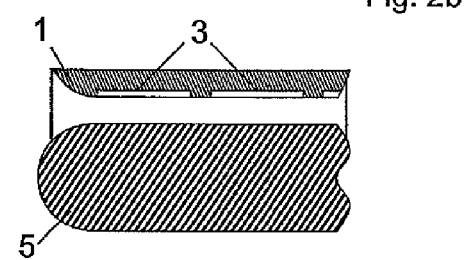
Fig. 2b
Fig. 2g
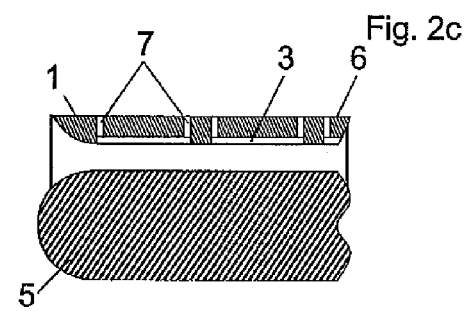
Fig. 2c
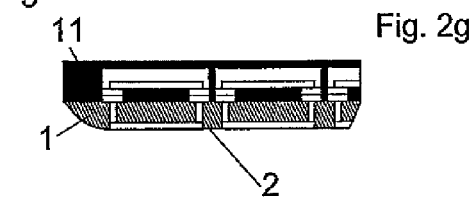
Fig. 2h
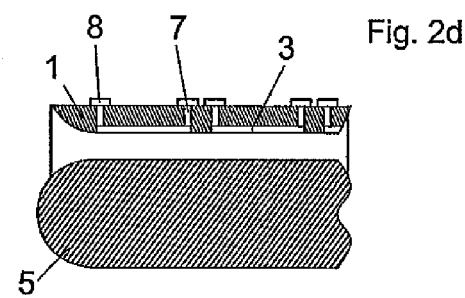
Fig. 2d
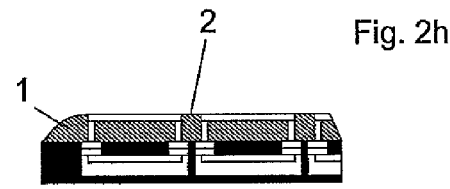
Fig. 2i
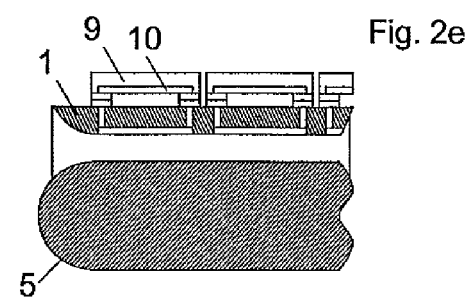
Fig. 2e
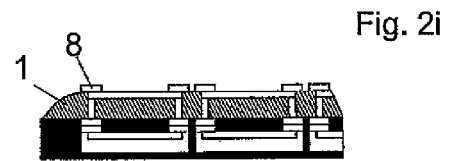
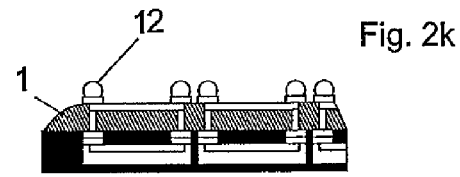
Fig. 2k

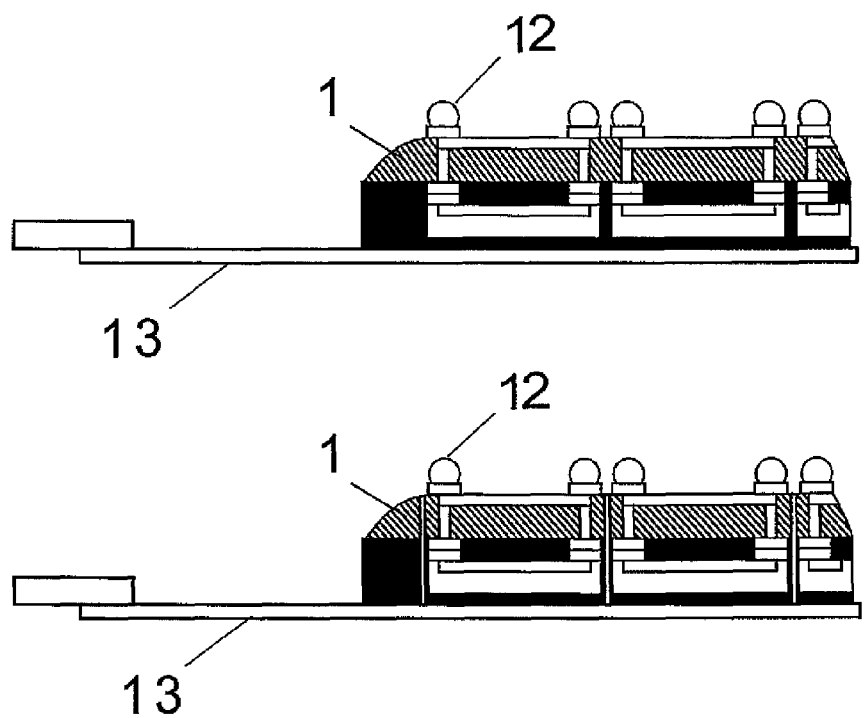
Fig. 2l
Fig. 2m
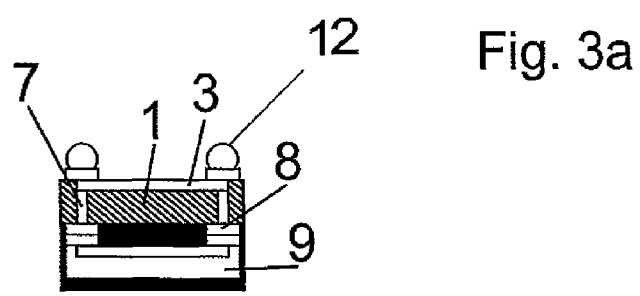
Fig. 3a
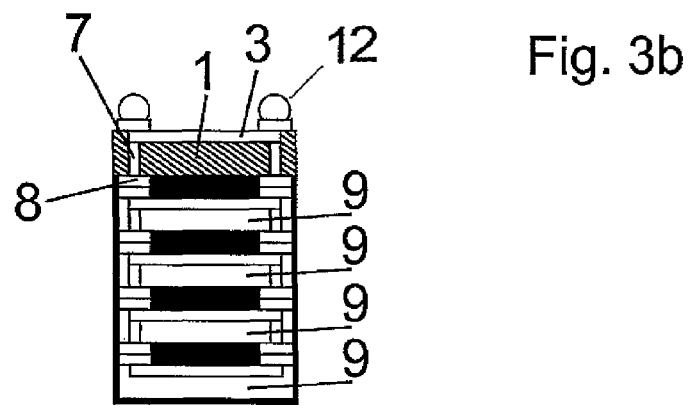
Fig. 3b

METHOD FOR BONDING OF CHIPS ON WAFERS

FIELD OF THE INVENTION

The invention relates to a method for bonding a plurality of chips onto a base wafer.

BACKGROUND OF THE INVENTION

As a result of the miniaturization pressure which is prevailing in the semiconductor industry, methods are needed with which so-called "3D Integrated Chips" (3D IC) can be produced. 3D ICs consist of chip stacks in which several chips are stacked vertically on top of one another and there are connections through the silicon to the vertically adjacent chips. The connections are called "Through Silicon Vias" (TSV).

These chips promise high packing density and higher performance at lower costs. Moreover, in this way new types and forms of chips can be produced. Fundamentally different methods are possible for producing 3D ICs, specifically the very time-consuming stacking of individual chips on individual chips, also called "Chip-to-Chip" (C2C) methods, or stacking of wafers on wafers, also called "Wafer to Wafer" (W2W) methods. Finally, the so-called "Chip to Wafer (C2W)" method is also discussed. A reasonable technical implementation has not been successful to date due to major technical problems. This invention relates to a technically feasible C2W method for producing 3D ICs.

Due to low throughput, C2C methods cause higher production costs and therefore may hardly be used in mass production.

W2W methods require that the two wafers have the same size and that the chips on the two wafers have the same size. The problem here is that the silicon utilization especially for higher chip stacks is below average (so-called yield). The attainable yield of functioning chips is lower than in C2C or C2W methods.

Technical problems in the implementation of a C2W method for producing chips stacks or 3D ICs are the handling of the wafers, especially with the chips stacked on them, and the most varied requirements, especially temperatures, for the stacking process and for the connectors (interfaces) of the chips for mounting on circuit boards or fundamentally the higher-order packing unit.

Handling of the base wafer therefore acquires great importance because fracture of the base wafer shortly before separation of a plurality of chip stacks on the wafer would lead to scrapping of thousands of expensive chips. Handling of the base wafer with a plurality of chip stacks fixed/bonded thereon becomes more difficult, the thinner and/or greater the area of the base wafer. The base wafer is the wafer on which the chips are stacked in the C2W method.

SUMMARY OF THE INVENTION

The object of the invention is to devise a method for producing chip stacks (3D ICs) as free of scrap as possible with a throughput as high as possible.

In accordance with the present invention, there is provided a method for bonding a plurality of chips onto a base wafer. The chips are stacked in several layers over the base wafer and electrically conductive connections exist between the vertically adjacent chips and the base wafer. The layer of chips is vertically adjacent to the base wafer, with the following steps in the indicated sequence:

a) fixing of the base wafer on a carrier,
b) placement of at least one layer of chips in defined positions on the base wafer, and
c) heat treatment of the chips (3) on the base wafer (1) fixed to the carrier.

Advantageous developments of the invention are given in the dependent claims. All combinations of at least two of the features given in the specification, in the claims and/or the drawings lie within the framework of the invention.

The invention is based on the idea of fixing the base wafer at least during the stacking of chips on the base wafer and during the heat treatment of the chips for bonding, fixing the wafer on a carrier or connecting it to the carrier.

By fixing the base wafer on the carrier it is possible with a surprising advantage for the throughput of the C2W method to separate the process steps of stacking or placing the chips in defined positions on the base wafer and the process step(s) of heat treatment or bonding of the chips on the base wafer. While heat treatment or the bonding step, depending on the material used, can take a very long time, the positioning or stacking and placement of the chips on the base wafer is a process step which can proceed very promptly, for example with several thousand chips per hour.

In this way, the throughput can be increased by there being several heat treatment chambers/bonding stations and/or several base wafers with stacked chips being processed in a heat treatment chamber/bonding station. Heat treatment chambers can be hot plates, continuous furnaces or the like. One especially advantageous process can be implemented with modified wafer bonding chambers which make it possible to apply pressure to the chips during the heat treatment process.

Compared to other methods, the possibility of being able to stack chips of different size in this method is especially advantageous.

By using a carrier which is not only loosely joined to the base wafer, stresses and cambers of the base wafer can be equalized or counteracted.

Handling is still further simplified by the carrier corresponding essentially to the size of the base wafer, especially by its not deviating more than 10 mm from the latter in radius.

Especially preferred fixing means are a negative pressure or vacuum, electrostatic means, mechanical clamping and/or cements, preferably heat-resistant cements being used in order to ensure secure fixing of the base wafer on the carrier even at high temperatures in heat treatment. Combinations of different fixing means or effects, depending on the type of connection to be established or the height of the chip stack or due to other factors, can lead to further improved handling.

In one preferred embodiment of the invention, alignment of the vertically adjacent chips takes place directly in the placement of the chips in defined positions, contacts of the chips to be placed being aligned and bonded with the corresponding contacts of the underlying layer of chips or contacts of the base wafer.

The chip yield in this method can be advantageously improved in that during placement of the chips it is watched that chips are placed only on functioning chips of the underlying layer. Even more preferably the function of all chips which are functionally joined to the chip to be placed is checked and a chip is placed only with the function of all chips which are to be functionally joined to the chip.

In the heat treatment or bonding step electrically conductive connections are produced between the wafer and the chip which has been placed on it or between the placed chips. Here it is advantageous if heating takes place in a suitable atmosphere which is preferably free of oxygen, so that oxidation of the metal contact surfaces is avoided. In particular this can be achieved by the use of a nitrogen atmosphere or another inert atmosphere, for example argon, for many applications not only an inert, but also a reducing atmosphere being especially advantageous. This property can be achieved for example by forming gas or formic acid vapor. Forming gas can be formed by mixing H2 with N2, especially between 2% H2 to 98% H2 and 15% H2 to 85% N2. In this mixture N2 can also be replaced by other inert gases.

So that the chips can be handled better and do not slide after they are placed, it is advantageous to cement the chips after placement, preferably with an organic cement which vaporizes during the following bonding step. Alternatively the chips can be fixed by a molecular connection which advantageously forms spontaneously at room temperature, for example between the Si surfaces, SiO2 surfaces or SiN surfaces.

The base wafer in one special configuration of the invention, especially by back grinding, has a thickness of less than 200 µm, especially less than 100 µm, preferably less than 50 µm, still more preferably less than 20 µm.

Especially many chips can be accommodated on a base wafer with a diameter of at least 200 mm, especially at least 300 mm, preferably at least 450 mm.

In one special embodiment of the invention it is possible only by this invention to apply solder bumps or C4 bumps after step B or C for connecting each chip stack to a board or fundamentally the next higher-order packing unit.

The solder bumps consist of a metal alloy with a low melting point and are generally used to connect the chips/chip stacks to other electrical/electronic components.

In particular, when using a base wafer with electrically conductive connections which penetrate the base wafer (TSVs) it is advantageous to pot the chips or chip stacks after step B or C in a mass which is characterized especially by high thermal and/or mechanical stability, especially a mass of organic and/or ceramic material. An embodiment is especially preferred in which at least in part epoxy resin is contained in the mass or the mass is formed entirely from epoxy resin. The epoxy resin-containing mass can be fiber-reinforced in one special embodiment of the invention.

In one advantageous embodiment of the invention the mass is pressurized after potting, especially by relief to atmospheric pressure after carrying out the potting below atmospheric pressure, preferably in a vacuum.

The base wafer can be advantageously taken from the carrier after potting by the action of the preferably duroplastic mass.

In one preferred embodiment of the invention the mass is worked such that the mass after potting or during potting is brought into the basic form corresponding to the base wafer and/or the mass is removed as far as the uppermost layer of the individual chip, especially is ground off. This additionally facilitates further handling of the body consisting of the base wafer, the potted chips and the mass, and especially known constructions for handling can be used. By removing the mass a cooling body can be advantageously applied to the uppermost layer by a precise planar surface being formed.

One especially preferred embodiment of the invention consists in that the base wafer and/or the carrier consist of silicon, therefore the carrier is likewise a wafer. It can be handled with the known constructions and has the additional advantage that the coefficient of thermal expansion of the carrier, to the extent the base wafer and carrier consist of silicon, is identical.

Other advantages, features and details of the invention will become apparent from the following description of preferred exemplary embodiments and using the drawings.

BRIEF DESCRIPTION OF THE DRAWINGS

FIGS. 2a to 2m show a schematic of a method sequence as claimed in the invention according to a first embodiment, FIG. 3a shows a schematic of a chip stack produced as claimed in the invention, FIG. 3b shows a schematic of a chip stack as claimed in the invention with several chips.

DETAILED DESCRIPTION OF PREFERRED EMBODIMENTS

In the figures the same components and parts with the same function are identified with the same reference numbers.

Figure 1:
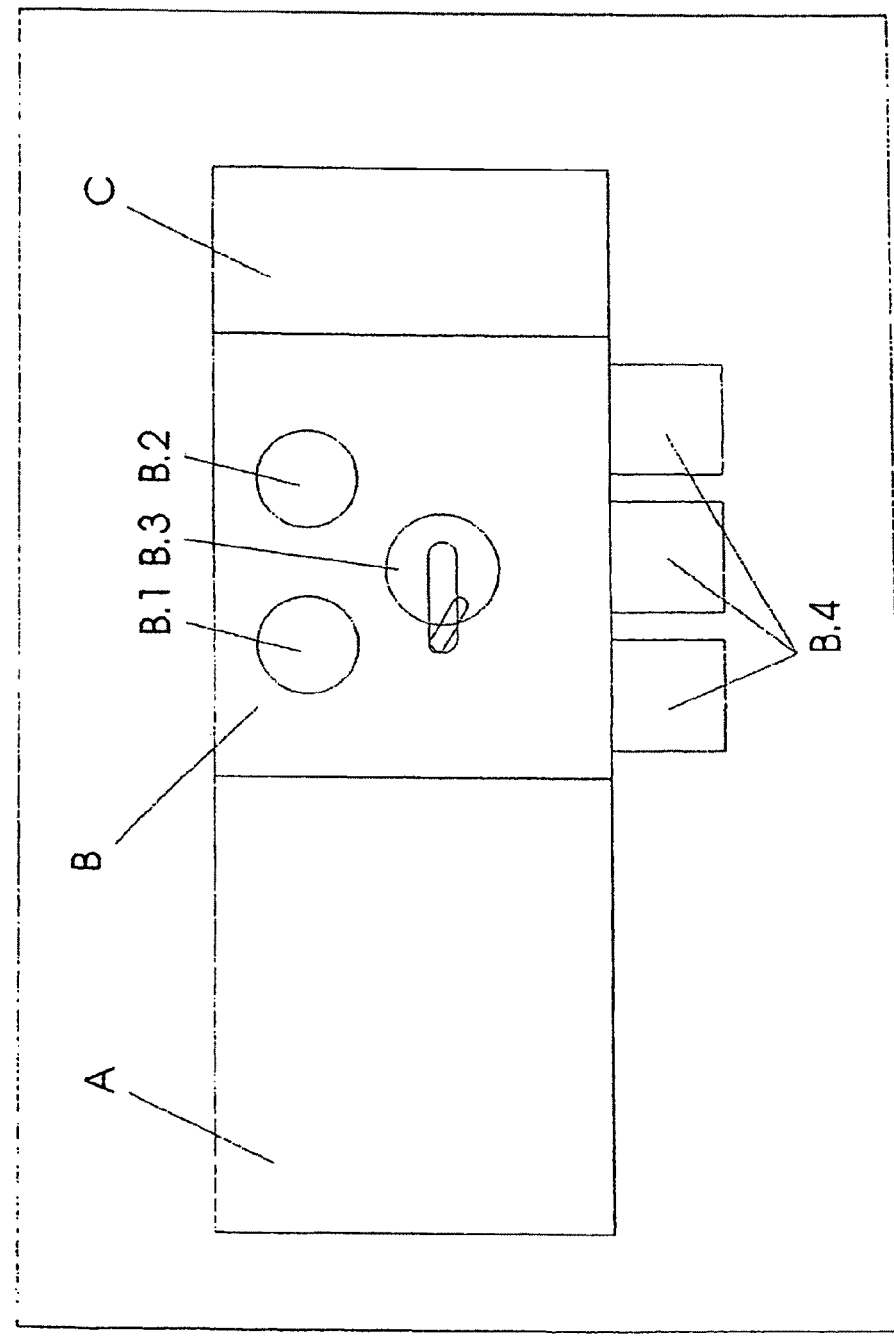
FIG. 1 shows the structure of a unit for implementation of the method as claimed in the invention.
Figure 4A:
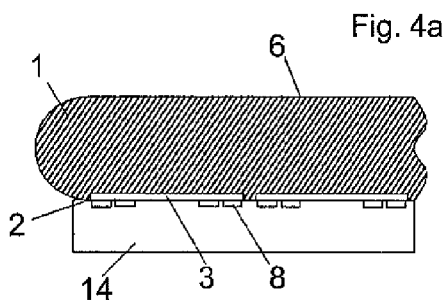
FIGS. 4a to 4i show a schematic of a method sequence as claimed in the invention according to a second embodiment.
Figure 4B:
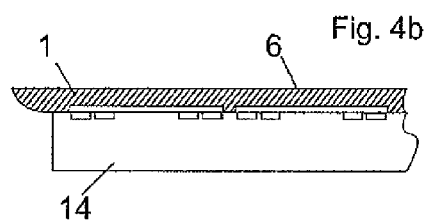
Figure 4C:
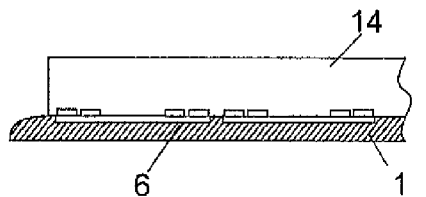
Figure 4D:
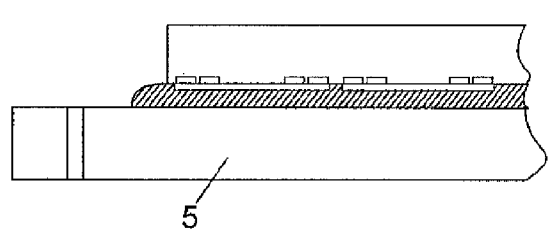
Figure 4E:
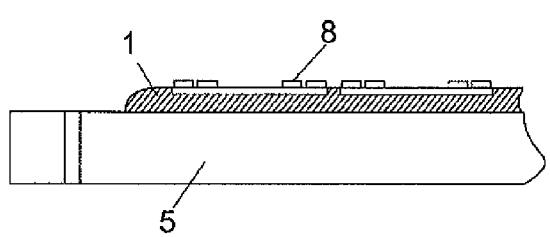
Figure 4F:
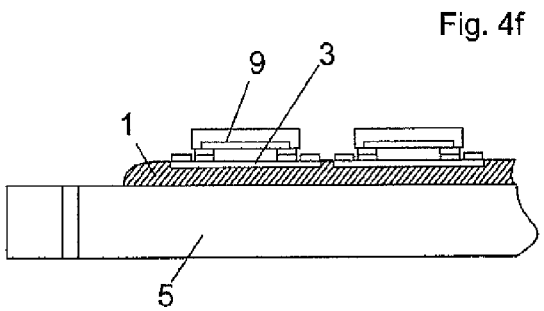

FIG. 1 shows the schematic structure of a unit for carrying out the method as claimed in the invention, in the region A placement of the chip layers on the base wafer taking place as shown in FIG. 2e or FIG. 4f, after the base wafer at station B.1 has been mounted, or in some other way, for example pre-mounted, on the carrier, and at the tape removal station B.2 a back grinding tape which is present from a previous back grinding process has been removed.

The carrier with the base wafer is handled by way of a robot B.3 with a robot arm.

On the handling module B there is a cassette station B.4 from which material necessary for the method is removed or delivered again.

After placement of the chip in the chip placement system A the carrier with the base wafer and the chips which are stacked on the base wafer and which are optionally fixed by way of a cement is routed to the bonding station C for heat treatment or bonding of the chips on the base wafer. During heat treatment or during bonding the next base wafer can be provided with chips. The bonding station C can also consist of several bonding units, since bonding, depending on the requirement profile, can take considerable time, especially compared to placement of the chips.

Other treatment steps of the chip stack bonded on the base wafer, such as for example the separation of the chip stacks in a dicing module, are not shown in FIG. 1, but can follow the bonding station C or preferably can be located in the region of the handling module B, therefore in FIG. 1 above the handling module B so that handling of the chip stack by way of the robot arm is possible. In one preferred embodiment of the invention the carrier can also be used in the dicing module, as a result of which the chip stack can also continue to be safely handled even after bonding with the base wafer.

FIG. 2a shows the silicon base wafer 1 whose front 2 is provided with chips 3 which are incorporated flush into the surface 2 by preceding treatment steps.

The base wafer 1 is connected to the carrier 5, here likewise a silicon wafer, by way of connecting means 4 in order to be able to be back-ground from the back 6 of the base wafer 1 as shown in FIG. 2b.

As shown in FIG. 2c, in the region of each chip 3 electrical connections 7 which extend from the back 6 of the base wafer 1 to the respective chip 3 are produced from the back 6 of the base wafer 1.

Electrically conductive laminae 8 are applied to the electrically conductive connections 7 on the back 6 of the base wafer 1 for electrical contact-making of individual chips (see FIG. 2d). In special embodiments of the invention the chips can also make contact directly with the electrically conductive connections 7, or other electrically conductive linking points can be produced. The individual chips 9 are formed from one chip 3 at a time and one holding device which holds the chip 3 and which consists of silicon.

As shown in FIG. 2e the individual chips 9 with their chip side 10 are applied to the electrically conductive laminae 8, and steps 2c to 2e can optionally be repeated several times in order to stack a plurality of individual chips 9 on one another (see FIG. 3b). This process sequence can take place with or without a heat treatment step or bonding step between the individual placement steps. Placement of the individual chips 9 on the base wafer 1 takes place at the chip placement station A.

In the process step as shown in FIG. 2f, the individual chips 9 or optionally several layers of individual chips 9 can be potted in a mass 11, in this exemplary embodiment epoxy resin.

After bonding of the chips and setting of the mass 11 the carrier 5 can be removed since the mass 11 sufficiently stabilizes the thin and large-area base wafer 1. The carrier 5 can be automatically detached by loosening the connecting means in the potting step as shown in FIG. 2f (depending on heat). Furthermore it can be advantageous to carry out the detachment step separately in a downstream process step, and the detachment step can be initiated either thermally, chemically or by the action of an external energy source (for example UV light, infrared light, laser, or microwave).

The base wafer 1 has been turned in the process step as shown in FIG. 2h so that the front 2 is now pointing up.

In another process step as shown in FIG. 2i, again electrically conductive laminae 8 are applied to the chips 3 which now lie at the top in order to apply solder bumps 12 as shown in FIG. 2k. The solder bumps 12 are used for later connection of the chips (3D ICs) to boards or the next higher-order packing unit/chip layer.

A series of versions is possible as the material for the connection between the chips 3. Fundamentally it is possible to distinguish between metallic compounds, organic compounds, inorganic compounds, and hybrid compounds. In the domain of metallic connections, metal diffusion connections, eutectic compounds which form during bonding, and eutectics which were already present before bonding and during bonding enable melting of the alloy, are possible. The latter are also the solder bumps 12 which are applied to the wafer in the form of balls and which enable production of connections essentially without applying pressure. Conductive polymers are also possible.

In the process step as shown in FIG. 2l, the base wafer with the chip stacks and solder bumps 12 is deposited on a dicing frame 13 in order to then separate the chip stacks from one another as shown in FIG. 2m (dicing).

Two examples for the chip stacks produced according to the above described method are shown in FIG. 3a and FIG. 3b, in FIG. 3a only an individual chip 9 having been mounted on the chip 3 of the base wafer 1, while in the chip stack as shown in FIG. 3b four individual chips 9 have been mounted on the base wafer 1.

FIG. 4a shows a base wafer 1 which has been cemented to a back grinding tape 14 and which is already provided with chips 3 and electrically conductive laminae 8, especially on the front 2 of the base wafer 1.

In the process step as shown in FIG. 4b, the base wafer 1 is back-ground from the back 6 and in FIG. 4c it is turned so that the back 6 of the base wafer 1 points down.

In the process step as shown in FIG. 4d the base wafer 1 with its back 6 is fixed on a carrier 5 and then the back grinding tape 14 is detached from the front 2 of the base wafer 1 (see FIG. 4e).

In the subsequent process step as shown in FIG. 4f, individual chips 9 are placed on corresponding electrically conductive laminae 8 on the chips 3 of the base wafer 1 and optionally fixed in the chip placement station A as shown in FIG. 1.

Figure 4G:
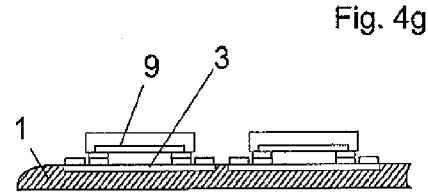
Figure 4H:
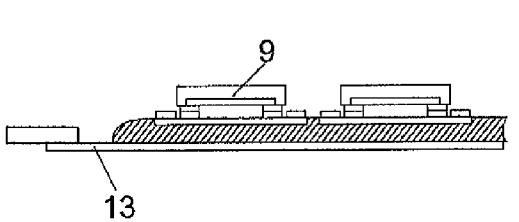
Figure 4I:
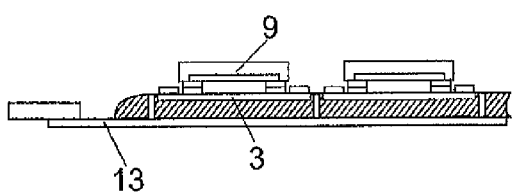

After the chip stacks have been placed and optionally fixed, the base wafer 1 with the chip stacks is applied to the dicing frame 13 in order to separate the individual chip stacks from one another (see FIGS. 4g, 4h and 4i).

The base wafer 1 can preferably also be applied with the carrier 5 to the dicing frame 13 in order to prevent fracture of the base wafer 1 and damage to the chips.

Figure 5A:
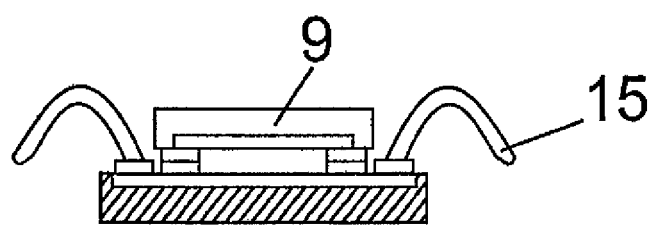
FIG. 5a shows a schematic of a chip produced as claimed in the invention and FIG. 5b shows a schematic of a chip stack produced as claimed in the invention with several chips.
Figure 5B:
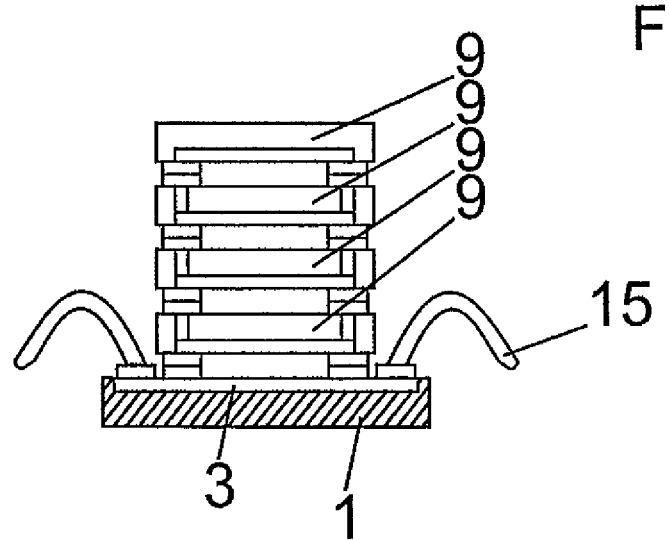

FIGS. 5a and 5b show examples of finished chip stacks which in contrast to the chip stacks shown in FIGS. 3a and 3b can be connected to a board (not shown) or to contacts of the final chip housing (also called a "lead frame") by way of line terminals 15 which are connected to the chips 3 in an electrically conductive manner, generally in the form of wires.

The invention claimed is:

1. Method for bonding a plurality of chips onto a base wafer using pressure and heat, the chips being stacked in several layers on the base wafer and electrically conductive connections disposed between vertically adjacent chips and between the base wafer and the layer of chips which is vertically adjacent to the base wafer, with the following steps in the indicated sequence:
   a) fixing the base wafer on a carrier,
   b) placing at least one layer of chips in defined positions on the base wafer,
   c) applying pressure to the layer of chips at the same time that the chips on the base wafer are heat treated and fixed to the carrier, potting the chips in a mass and setting the mass to stabilize the base wafer,
   d) detaching the carrier after step c), and
   e) dicing the chip stacks.

2. Method according to claim 1, wherein the steps b) and c) are carried out in different devices.

3. Method as claimed in claim 1, wherein the carrier is comprised of at least partially of silicon and corresponds essentially to the size of the base wafer.

4. Method as claimed in claim 1, wherein fixing means are used for fixing the base wafer to the carrier.

5. Method as claimed in claim 1, wherein the chips are aligned and bonded during placement in defined positions with contacts of the corresponding contacts of the underlying layer of chips or of the base wafer.

6. Method as claimed in claim 1, wherein chips are placed during placement only on functioning chips of the underlying layer.

7. Method as claimed in claim 1, wherein heat treatment takes place in an atmosphere free of oxygen.

8. Method as claimed in claim 1, wherein the chips after placement are cemented with an organic cement.

9. Method as claimed in claim 1, wherein the base wafer has a thickness of less than 200 μm.

10. Method as claimed in claim 1, wherein the base wafer has a diameter of at least 200 mm.

11. Method as claimed in claim 1, wherein the chips or chip stacks after step b) or c) are potted in a mass having high thermal and/or mechanical and/or chemical stability and/or water-repellent properties.

12. Method as claimed in claim 11, wherein the mass is pressurized after potting, after carrying out the potting below atmospheric pressure.

13. Method as claimed in one of claims 11 or 12, wherein the mass is poured in liquid form at room temperature or at a higher temperature.

14. Method as claimed in claim 13, wherein the base wafer with the mass and the chips potted in the mass after potting or during potting is brought into the basic form corresponding to the base wafer and/or the mass is removed as far as the uppermost layer of the individual chips.

15. Method as claimed in claim 1 wherein after step b) or c), solder bumps are applied for connection of each chip stack to a board or another chip stack.

16. Method as claimed in claim 1, wherein the base wafer and/or the carrier consist of silicon.

17. Method as claimed in claim 1, wherein at least two layers of chips are applied to the base wafer.

18. Method as claimed in claim 1, wherein the chips or chip stacks after step b) or c) are hot stamped with a mass.

19. Method as claimed in claim 1, wherein the base wafer with the chips stacked on it is fixed on a dicing frame before the base wafer is separated from the carrier.

20. Method for bonding a plurality of chips onto a base wafer using pressure and heat, the chips being stacked in several layers on the base wafer and electrically conductive connections disposed between vertically adjacent chips and between the base wafer and the layer of chips which is vertically adjacent to the base wafer, with the following steps in the indicated sequence:
   a) fixing the base wafer on a carrier,
   b) placing at least one layer of chips in defined positions on the base wafer,
   c) applying pressure to the layer of chips at the same time that the chips on the base wafer are heat treated and fixed to the carrier, potting the chips in a mass and setting the mass to stabilize the base wafer,
   d) immediately detaching the carrier after step c), and
   e) dicing the chip stacks.

21. Method as claimed in claim 4, wherein the fixing means is at least one of the following:
   a vacuum, an electrostatic means, mechanical clamping or a cement.

22. Method as claimed in claim 21, wherein the cement is a heat-resistant cement.

23. Method as claimed in claim 7, wherein the atmosphere is comprised of at least one of the following: an inert atmosphere, a reducing atmosphere, or an atmosphere of forming gas or formic acid.

24. Method as claimed in claim 1, wherein the chips after placement are fixed by a molecular connection.

25. Method as claimed in claim 11, wherein the mass is comprised of at least one of the following: an organic material or a ceramic material.

26. Method as claimed in claim 25, wherein the organic material is an epoxy resin.

27. Method as claimed in claim 18, wherein the mass is a thermoplastic material.

* * * * *